(12) United States Patent
Lee

(10) Patent No.: US 9,457,373 B2
(45) Date of Patent: Oct. 4, 2016

(54) UNIT MASK FIXED TO A FRAME WITH A FIRST BENT EXTENSION

(71) Applicant: Samsung Display Co., Ltd., Yongin, Gyeonggi-do (KR)

(72) Inventor: Sang-Shin Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 323 days.

(21) Appl. No.: 14/082,989

(22) Filed: Nov. 18, 2013

(65) Prior Publication Data

US 2014/0141556 A1 May 22, 2014

(30) Foreign Application Priority Data

Nov. 20, 2012 (KR) .................. 10-2012-0131867

(51) Int. Cl.
| | | |
|---|---|---|
| C23C 14/00 | (2006.01) |
| B05C 11/11 | (2006.01) |
| B05C 17/08 | (2006.01) |
| H01L 51/56 | (2006.01) |
| H05K 3/18 | (2006.01) |
| H05K 3/12 | (2006.01) |
| B05C 21/00 | (2006.01) |
| C23C 14/04 | (2006.01) |
| H01L 51/00 | (2006.01) |

(52) U.S. Cl.
CPC ............ B05C 17/08 (2013.01); B05C 21/005 (2013.01); C23C 14/042 (2013.01); H01L 51/0011 (2013.01); H01L 51/56 (2013.01); H05K 3/1225 (2013.01); H05K 3/184 (2013.01)

(58) Field of Classification Search
CPC ........... H01L 51/5209; H01L 51/5225; H01L 51/56; H01L 51/0011; H01L 21/027; H01L 21/682; H01L 21/68785; B05C 21/005; B05C 17/08; B05B 15/045; C23C 16/042; C23C 14/042; H05K 3/1225; H05K 3/184; H05K 13/0069; H01J 29/073
USPC .......................... 438/34; 118/504, 720, 721
See application file for complete search history.

(56) References Cited

U.S. PATENT DOCUMENTS

| | | | | |
|---|---|---|---|---|
| 8,815,015 B2* | 8/2014 | Kobayashi | ............ | C23C 14/042 118/720 |
| 2003/0156271 A1* | 8/2003 | Byun | .................... | G03F 7/2014 355/75 |
| 2006/0098185 A1 | 5/2006 | Byun et al. | | |
| 2006/0103289 A1 | 5/2006 | Kim et al. | | |
| 2006/0267473 A1 | 11/2006 | Tulli et al. | | |
| 2007/0184195 A1* | 8/2007 | Hatakeyama | ......... | C23C 14/042 427/282 |
| 2009/0260566 A1* | 10/2009 | Landgraf | .............. | C23C 14/042 118/504 |
| 2011/0146573 A1 | 6/2011 | Park | | |
| 2012/0325143 A1* | 12/2012 | Kang | .................... | C23C 14/042 118/504 |
| 2013/0318774 A1* | 12/2013 | Kang | .................... | B05C 21/005 29/592 |

FOREIGN PATENT DOCUMENTS

| | | |
|---|---|---|
| CN | 1439916 | 9/2003 |
| CN | 1776525 | 5/2006 |
| CN | 101013274 | 8/2007 |
| CN | 102094168 | 6/2011 |
| JP | 2006-513549 | 4/2006 |
| KR | 10-2007-0064906 | 6/2007 |
| KR | 10-2009-0053417 | 5/2009 |

* cited by examiner

*Primary Examiner* — Karl Kurple

(74) *Attorney, Agent, or Firm* — Knobbe Martens Olson & Bear LLP

(57) ABSTRACT

A unit mask is extended in a direction and is supported by a frame including an opening. The unit mask includes a first fixed part located in the opening and fixed to one surface of the frame disposed in the direction, a second fixed part spaced apart from the first fixed part and fixed to another surface of the frame disposed in the direction, and a mask part held by the first fixed part and the second fixed part between the first fixed part and the second fixed part.

14 Claims, 3 Drawing Sheets

UNIT MASK FIXED TO A FRAME WITH A FIRST BENT EXTENSION

CROSS-REFERENCE TO RELATED APPLICATIONS

This application claims priority to and the benefit of Korean Patent Application No. 10-2012-0131867 filed in the Korean Intellectual Property Office on Nov. 20, 2012, the entire contents of which are incorporated herein by reference.

BACKGROUND

1. Field

The described technology relates generally to a unit mask supported by a frame and a mask assembly.

2. Description of the Related Technology

Examples of a flat panel display include an organic light emitting diode (OLED) display, a liquid crystal display (LCD) and a plasma display panel (PDP).

To manufacture the OLED display, it is typically necessary to form an electrode in a specific pattern, and an emission layer. A deposition method using a mask assembly can be used to form the electrode and the emission layer.

A conventional mask assembly generally includes a frame having an opening and a plurality of unit masks in a band shape. Both ends of each unit mask are extended corresponding to the opening and fixed to the frame. The unit masks can include patterned openings corresponding to pixels of OLED displays such that the OLED displays can be manufactured on a mother substrate. The patterned opening of each unit mask can correspond to a single OLED display and is formed in a shape corresponding to an electrode or an emission layer to be formed in the OLED display.

When a high definition OLED display is required, a fine patterned opening is formed in the unit mask. To achieve this, the unit mask needs to be very thin (in μm) in order to prevent unintended deposition error because of characteristics of a deposition process.

However, when the unit mask becomes very thin, it can be difficult to weld both ends of the unit mask to the frame to fix the unit mask to the frame.

Furthermore, when the unit mask is very thin, the unit mask may sag through the opening since both ends thereof are extended and fixed to the frame or the unit mask may deformed due to a tensile force applied to the unit mask.

The above information disclosed in this Background section is only for enhancement of understanding of the background of the described technology and therefore it may contain information that does not form a part of the prior art that is already known in this country to a person of ordinary skill in the art.

SUMMARY OF CERTAIN INVENTIVE ASPECTS

The described technology has been made in an effort to provide a unit mask and a mask assembly having advantages of improving deposition reliability when a high definition OLED display is manufactured.

A first aspect of the present invention provides a unit mask extended in a direction and supported by a frame including an opening, the unit mask including a first fixed part located in the opening and fixed to one surface of the frame disposed in the direction, a second fixed part spaced apart from the first fixed part and fixed to another surface of the frame disposed in the one direction, and a mask part held by the first fixed part and the second fixed part between the first fixed part and the second fixed part.

The mask part may be thinner in a perpendicular direction than the first fixed part and the second fixed part.

The first fixed part may include a first bent extension bent and extended downward through the opening, the second fixed part may include a second bent extension bent and extended downward through the opening, and the mask part may include a body extended in the one direction, a first facing part bent and extended from the body through the opening and facing the first bent extension, and a second facing part bent and extended from the body through the opening and facing the second bent extension.

The unit mask may further includes a first block located between the frame and the first bent extension and contacting the first bent extension, and a second block facing the first block with the first bent extension and the first facing part disposed between the first block and the second block and contacting the first facing part.

The second block may be thicker in a perpendicular direction than the first block.

The unit mask may further include a third block located between the first bent extension and the first facing part and contacting the first bent extension and the first facing part.

The unit mask may further include a first fastener penetrating the first bent extension, the first block, the first facing part and the second block to fasten the first bent extension, the first block, the first facing part and the second block.

The surface of the first block contacting the first bent extension and the surface of the second block contacting the first facing part may have uneven shapes.

The surface of the first block contacting the first bent extension, the surface of the second block contacting the first facing part and the surface of the third block contacting the first bent extension and the first facing part may have uneven shapes.

The uneven surface of the second block may be spaced apart from the body of the mask part.

The first bent extension may have an uneven shape corresponding to the uneven surface of the first block and the first facing part may have an uneven shape corresponding to the uneven surface of the second block.

The first bent extension may contact the first facing part.

The unit mask may further include a fourth block located between the frame and the second bent extension and contacting the second bent extension, and a fifth block facing the fourth block, having the second bent extension and the second facing part located between the fourth block and the fifth block, and contacting the second facing part.

The unit mask may further include a sixth block located between the second bent extension and the second facing part and contacting the second bent extension and the second facing part.

The unit mask may further include a second fastener penetrating the second bent extension, the fourth block, the second facing part and the fifth block to fasten the second bent extension, the fourth block, the second facing part and the fifth block.

A second aspect of the present invention provides a mask assembly including a frame including an opening, and the unit mask extended in a direction and supported by the frame.

A third aspect of the present invention provides a method of manufacturing an OLED display including forming an electrode in a specific pattern, and an emission layer on a substrate by deposition using a mask assembly.

The mask assembly may include patterned openings corresponding to pixels of the OLED display.

According to certain embodiments, it is possible to provide a unit mask and a mask assembly having improved deposition reliability when a high definition OLED display is manufactured.

DETAILED DESCRIPTION OF CERTAIN INVENTIVE EMBODIMENTS

Figure 1:
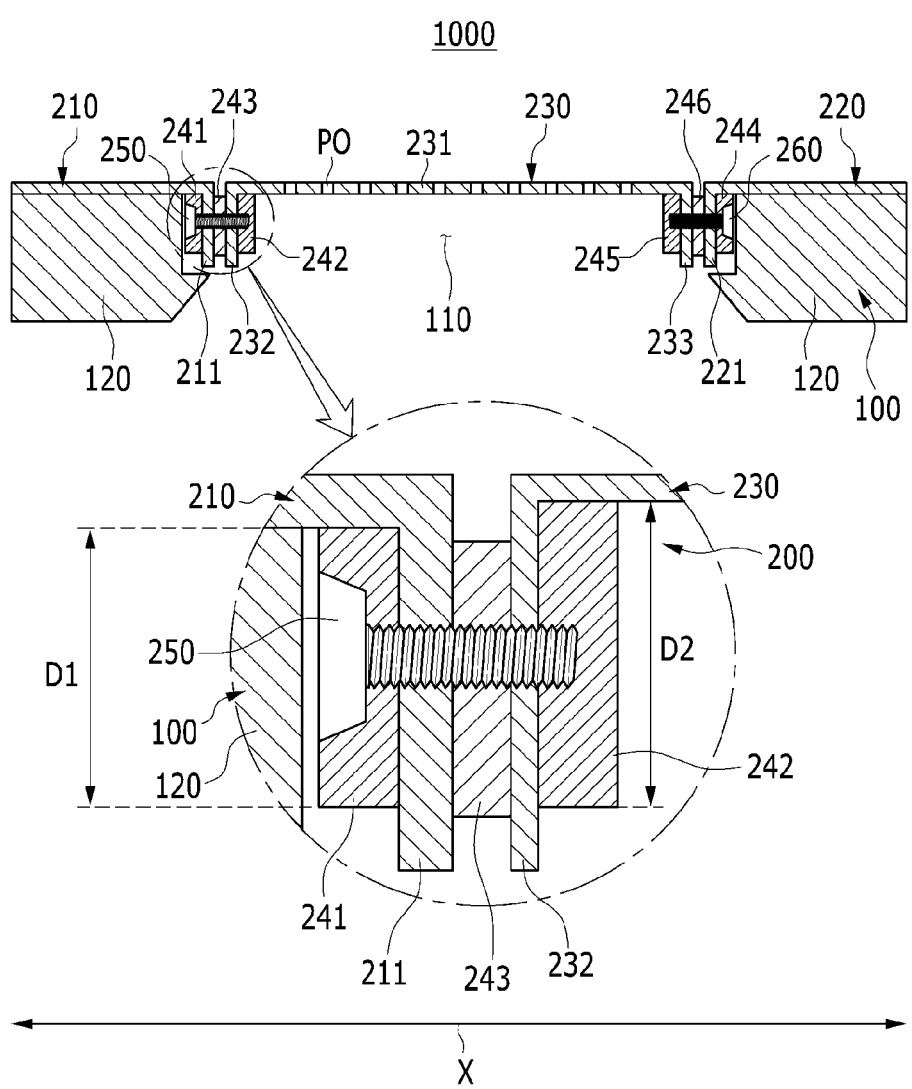
FIG. 1 is a cross-sectional view of a mask assembly according to a first embodiment.

The present invention will be described more fully hereinafter with reference to the accompanying drawings, in which certain embodiments of the invention are shown. As those skilled in the art would realize, the described embodiments may be modified in various ways, without departing from the spirit or scope of the present invention.

The drawings and description are to be regarded as illustrative in nature and not restrictive. Like reference numerals generally designate like elements throughout the specification.

In disclosed embodiments, the same reference numbers will be used to refer to the same or like parts. A first embodiment is described as a representative embodiment and only parts of other embodiments, which are different from the first embodiment, are described.

In the drawings, dimensions and thicknesses of components may be exaggerated, omitted or schematically illustrated for clarity and convenience of description. In addition, dimensions of constituent elements do not entirely reflect actual dimensions thereof.

In the drawings, the thickness of layers, films, panels, regions, etc., may be exaggerated for clarity. In addition, thicknesses of some layers and areas may be exaggerated for better understanding and ease of description. In the following description of the embodiments, it will be understood that, when an element such as a layer (film), region, pattern, or structure is referred to as being "on" or "under" another element, it can be "directly" on or under another element or can be "indirectly" formed such that an intervening element is also present. Also, terms such as "on" or "under" should be understood on the basis of the drawings.

In addition, unless explicitly described to the contrary, the word "comprise" and variations such as "comprises" or "comprising", will be understood to imply the inclusion of stated elements but not the exclusion of any other elements. Furthermore, the expression "on" or "under" may be used herein to represent the relationship of one element to another element as illustrated in the figures. It will be understood that this expression is intended to encompass different orientations of the elements in addition to the orientation depicted in the figures, namely, to encompass both "on" and "under".

A description will be given of a mask assembly according to a first embodiment with reference to FIG. 1.

FIG. 1 is a cross-sectional view of a mask assembly according to a first embodiment.

As shown in FIG. 1, a mask assembly 1000 according to the first embodiment includes a frame 100 and a unit mask 200.

The frame 100 fixes and supports both ends of the unit mask 200 and includes an opening 110 that exposes the unit mask 200. The frame 100 includes a pair of holders 120 facing each other in one direction (X direction) in which the unit mask 200 is extended, having the opening 110 disposed between the holders 120 and a pair of other holders (not shown) facing each other in a direction perpendicular to the direction (X direction), having the opening 110 disposed between the other holders. The holders 120 hold both ends of the unit mask 200. In the frame 100 of the mask assembly 1000 according to the first embodiment, the holders 120 may form long sides of the frame 100 which may have a rectangular shape and the other holders (not shown) may form short sides of the frame 100.

Alternatively, the frame of the mask assembly may have a polygonal or circular shape.

The unit mask 200 fixed to the frame 100 is supported by the frame 100 while a tensile force is applied to the unit mask 200. Since a compressive force acts in the direction in which the unit mask 200 is extended according to the tensile force applied to the unit mask 200, the frame 100 can be formed of a metal having high hardness such as, for example, stainless steel such that the unit mask 200 is not deformed by the compressive force.

The unit mask 200 is extended in one direction (X direction) and both ends thereof are fixed to the frame 100. The unit mask 200 includes a patterned opening PO that corresponds to an OLED display and exposes a mother substrate on which the OLED display will be formed during a deposition process. The patterned opening PO is an open pattern corresponding to interconnection lines or an emission layer of the OLED display. A plurality of unit masks 200 may be provided, and the unit masks 200 may be arranged in a direction perpendicular to the X direction.

Both ends of the unit mask 200 are fixed to the frame 100 while the unit mask 200 is extended in the X direction. The unit mask 200 includes a first fixed part 210, a second fixed part 220, a mask part 230, a first block 241, a second block 242, a third block 243, a first fastener 250, a fourth block 244, a fifth block 245, a sixth block 246, and a second fastener 260.

The first fixed part 210 is located in the opening 110 and fixed to the surface of one of the holders 120 of the frame 100, which are disposed in the X direction. The first fixed part 210 is fixed to the surface of the holder 120 of the frame 100 through a fixing method such as welding and includes a first bent extension 211 that is bent and extended downward from the surface of the holder 120 through the opening.

The second fixed part 220 is spaced apart from the first fixed part 210 and fixed to the surface of the other holder 120 of the frame 100, which are disposed in the X direction. The second fixed part 220 is fixed to the surface of the other holder 120 of the frame 100 through a fixing method such as welding and includes a second bent extension 221 that is bent and extended downward from the surface of the other holders 120 through the opening 110.

The mask part 230 is held by the first fixed part 210 and the second fixed part 220 between the first fixed part 210 and the second fixed part 220 and includes a body 231 that has the patterned opening OP and is extended in the X direction, a first facing part 232 that is bent from one end of the body 231 and extended downward through the opening 110 and faces the first bent extension 211, and a second facing part 233 that is bent from the other end of the body 231 and extended downward through the opening 110 and faces the second bent extension 221. The body 231, the first fixed part 210 and the second fixed part 220 of the mask part 230 are disposed on a flat virtual straight line. The mother substrate on which deposition will be performed may be located on the body 231 of the mask part 230 during a deposition process. In this case, the mother substrate can come into contact with the body 231, the first fixed part 210 and the second fixed part 220 and a gap is not generated between the unit mask 110 and the mother substrate since the body 231, the first fixed part 210 and the second fixed part 220 are disposed on a flat virtual straight line. This improves reliability of deposition using the mask assembly 1000.

The mask part 230 may be thinner than the first fixed part 210 and the second fixed part 220, and thus a fine pattern opening PO can be formed in the thin mask part 230. Accordingly, unintended deposition error such as shadow is minimized when the high definition OLED display is manufactured.

The first fixed part 210 and the second fixed part 220 may be thicker than the mask part 230, and thus the first fixed part 210 and the second fixed part 220 can be fixed to the frame 100 using a welding process. Accordingly, it is possible to securely fix the unit mask 200 to the frame 100 through welding regardless of the thickness of the mask part 230 according to the size of the patterned opening PO.

That is, since the fine patterned opening PO used for a deposition process is formed in the mask part 230 and the unit mask 200 is fixed to the frame 100 by welding the first fixed part 210 and the second fixed part 220 to the frame 100, it is possible to provide the mask assembly 1000 having the unit mask 200 securely fixed to the frame 100 through welding and improve deposition reliability when a high definition OLED display is manufactured.

The first block 241 is located between the frame 100 and the first bent extension 211 and is in contact with the first bent extension 211.

The second block 242 is located opposite to the first block 241 having the first bent extension 211 and the first facing part 232 disposed between the first and second blocks 241 and 242 and is in contact with the first facing part 232. The thickness D2 of the second block 242 is greater than the thickness D1 of the first block 241. Since the thickness D2 of the second block 242 is greater than the thickness D1 of the first block 241, a height difference is not generated between the top face of the first fixed part 210 and the top face of the mask part 230 and the strength of the mask part 230 thinner than the first fixed part 210 is reinforced even when the mask part 230 is thinner than the first fixed part 210.

The third block 243 is located between the first bent extension 211 and the first facing part 232 and is in contact with the first bent extension 211 and the first facing part 232.

The first block 241, the second block 242 and the third block 243 may have elasticity.

The first fastener 250 penetrates the first block 241, the first bent extension 211, the third block 243, the first facing part 232 and the second block 242 and fastens the first block 241, the first bent extension 211, the third block 243, the second bent extension 221 and the second block 242. The first fastener 250 may have a screw shape and screw threads can be formed in the first block 241, the first bent extension 211, the third block 243, the second bent extension 221 and the second block 242 such that the first fastener 250 is combined with the screw threads.

The mask part 230 is held by the first fixed part 210 according to the first block 241, the second block 242, the third block 243 and the first fastener 250, and thus strength of the first fixed part 210 and mask part 230 is improved and, at the same time, the mask part 230 is securely fixed to the first fixed part 210.

The fourth block 244 is located between the frame 100 and the second bent extension 221 and is in contact with the second bent extension 221.

The fifth block 245 is located opposite to the fourth block 244 having the second bent extension 221 and the second facing part 233 disposed between the fourth and fifth blocks 244 and 245 and is in contact with the second facing part 233. The fifth block 245 is thicker than the fourth block 244 and fifth block 245 is thicker than the fourth block 244, and thus a height difference is not generated between the top face of the second fixed part 220 and the top face of the mask part 230 and the strength of the mask part 230 thinner than the second fixed part 220 is improved even though the mask part 230 is thinner than the second fixed part 230.

The sixth block 246 is located between the second bent extension 221 and the second facing part 233 and is in contact with the second bent extension 221 and the second facing part 233.

The fourth block 244, the fifth block 245 and the sixth block 246 may have elasticity.

The second fastener 260 penetrates the fourth block 244, the second bent extension 221, the sixth block 246, the second facing part 233 and the fifth block 245 and fastens the fourth block 244, the second bent extension 221, the sixth block 246, the second facing part 233 and the fifth block 245. The second fastener 260 may have a screw shape and screw threads may be formed in the fourth block 244, the second bent extension 221, the sixth block 246, second facing part 233 and the fifth block 245 such that the second fastener 260 penetrating the fourth block 244, the second bent extension 221, the sixth block 246, the second facing part 233 and the fifth block 245 is combined with the screw threads.

The mask part 230 is held by the second fixed part 220 according to the fourth block 244, the fifth block 245, the sixth block 246 and the second fastener 260, and thus the strength of the second fixed part 220 and the mask part 230 is improved and, at the same time, the mask part 230 is securely supported by the second fixed part 220.

As described above, in the mask assembly 1000 according to the first embodiment, the unit mask 200 including the first fixed part 210, the second fixed part 220, the mask part 230, the first block 241, the second block 242, the third block 243, the first fastener 250, the fourth block 244, the fifth block 245, the sixth block 246 and the second fastener 260 is extended in the X direction and the first fixed part 210 and the second fixed part 220 corresponding to both ends of the unit mask 200 are fixed to the frame 100, and thus the unit mask 200 is securely fixed to the frame 100 through welding and deposition reliability when the high definition OLED display is manufactured is improved.

Furthermore, in the mask assembly 100 according to the first embodiment, the length of the mask part 230 of the unit mask 200, to which a tensile force is actually applied, is shorter than the length of the unit mask 200, and thus the mask part 230 is prevented from sagging through the opening 110 even though the mask part 230 is thin. That is, a mask assembly 1000 having improved deposition reliability of the deposition process is provided.

Moreover, since the mask assembly 1000 according to the first embodiment is constructed in such a manner that the mask part 230 having the patterned opening PO is held by the first through sixth blocks 241-246, which can have elasticity, between the first fixed part 210 and the second fixed part 220, a tensile force applied to the mask part 230 is dispersed by the first through sixth blocks 241-246, and thus the mask part 230 is prevented from being deformed according to the tensile force applied to the unit mask 200. That is, deformation of the unit mask 200 due to tensile force is minimized.

A description will be given of a mask assembly according to a second embodiment with reference to FIG. 2.

In the first and second embodiments, the same reference numbers will be used to refer to the same or like parts.

Figure 2:
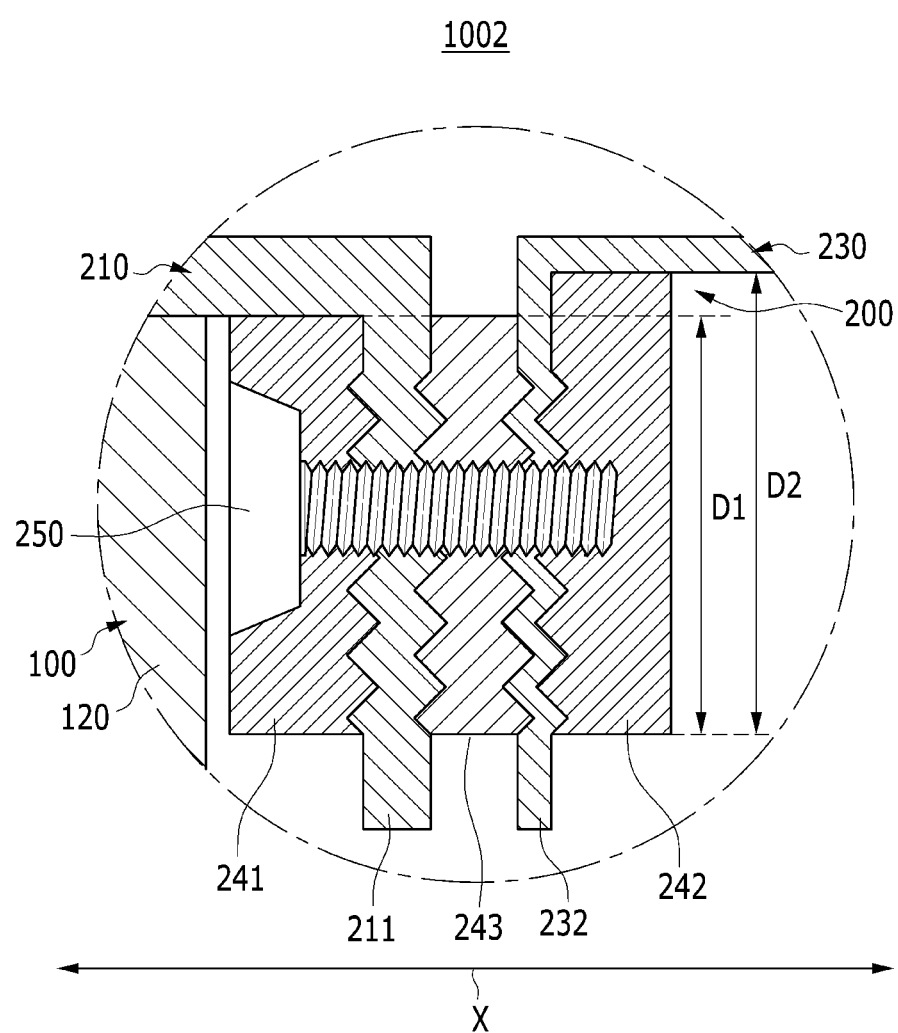
FIG. 2 is a cross-sectional view showing part of a mask assembly according to a second embodiment.

FIG. 2 is a cross-sectional view showing part of a mask assembly according to the second embodiment.

As shown in FIG. 2, the unit mask 200 of a mask assembly 1002 according to the second embodiment is extended in the X direction and both ends thereof are fixed to the frame 100. The unit mask 200 includes the first fixed part 210, the second fixed part 220, the mask part 230, the first block 241, the second block 242, the third block 243, the first fastener 250, the fourth block 244, the fifth block 245, the sixth block 246 and the second fastener 260.

The surface of the first block 241, which is in contact with the first bent extension 211, the surface of the second block 242, which is in contact with the first facing part 232, and both surfaces of the third block 243, which come into contact with the first bent extension 211 and the first facing part 232, have uneven shapes. The fourth block 244, the fifth block 245 and the sixth block 246 may have uneven surfaces.

The uneven surfaces of the first block 241, the second block 242 and the third block 243 have saw-toothed shapes engaged with the first bent extension 211 and the first facing part 231.

Since the first block 241, the second block 242 and the third block 243 have uneven surfaces, the first bent extension 211 has an uneven shape corresponding to the uneven surface of the first block 241 and the first facing part 231 has an uneven shape corresponding to the uneven surface of the second block 242.

The uneven surface of the second block 242 is spaced apart from the body 231 of the mask part 230 and the uneven surface of the first block 241 is spaced apart from the top face of the first fixed part 210. It is possible to prevent the body 231 of the mask part 230 from wrinkling due to the uneven surface of the second block 242 because the uneven surface of the second block 242 is spaced apart from the body 231 of the mask part 230.

The first block 241, the second block 242 and the third block 243 have uneven surfaces and the first bent extension 211 and the first facing part 231 have uneven shapes in contact with the first block 241, the second block 242 and the third block 243, and thus the first fixed part 210 and the mask part 230 are prevented from being detached from the first block 241 and the second block 242 when a tensile force is applied to the unit mask 200.

That is, the deposition reliability of the mask assembly 1002 is improved.

A description will be given of a mask assembly according to a third embodiment with reference to FIG. 3.

In the first and third embodiments, the same reference numbers will be used to refer to the same or like parts.

Figure 3:
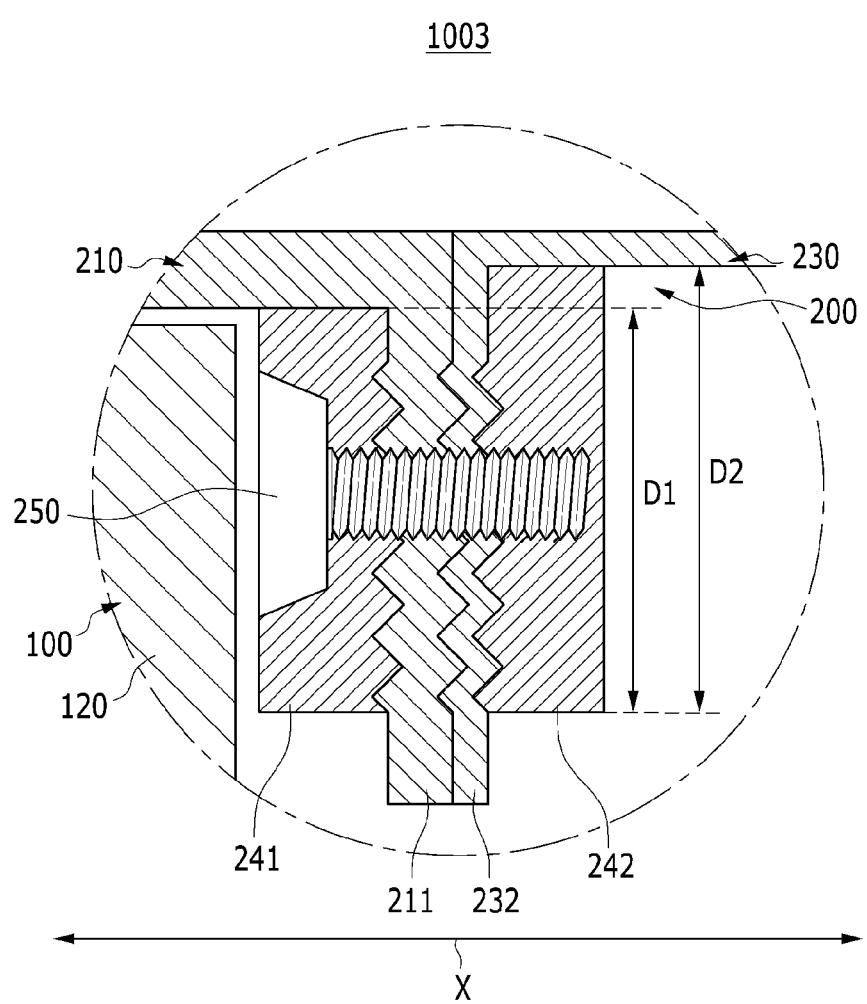
FIG. 3 is a cross-sectional view showing part of a mask assembly according to a third embodiment.

FIG. 3 is a cross-sectional view showing part of the mask assembly according to the third embodiment.

As shown in FIG. 3, the unit mask 200 of the mask assembly 1003 according to the third embodiment is extended in the X direction and both ends thereof fixed to the frame 100. The unit mask 200 includes the first fixed part 210, the second fixed part 220, the mask part 230, the first block 241, the second block 242, the first fastener 250, the fourth block 244, the fifth block 245, and the second fastener 260.

The surface of the first block 241, which is in contact with the first bent extension 211, and the surface of the second block 242, which is in contact with the first facing part 232, have uneven shapes.

The first bent extension 211 may come into contact with the first facing part 232 and the second bent extension 221 may come into contact with the second facing part 233.

The uneven surfaces of the first block 241 and the second block 242 have saw-toothed shapes engaged with the first bent extension 211 and the first facing part 231.

Since the first block 241 and the second block 242 have uneven surfaces, the first bent extension 211 has an uneven shape corresponding to the uneven surface of the first block and the first facing part 231 has an uneven shape corresponding to the uneven surface of the second block 242.

The uneven surface of the second block 242 is spaced apart from the body 231 of the mask part 230 and the uneven surface of the first block 241 is spaced apart from the top face of the first fixed part 210. Since the uneven surface of the second block 242 is spaced apart from the body 231 of the mask part 230, the body 231 of the mask part 230 is prevented from wrinkling due to the uneven surface of the second block 242.

The first block 241 and the second block 242 have the uneven surfaces and the first bent extension 211 and the first facing part have uneven shapes in contact with each other, and thus a tensile force applied to the unit mask 200 is easily transmitted to the mask part 230 from the first fixed part 210 and the second fixed part 220.

That is, deposition reliability of the mask assembly 1003 is improved.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A unit mask extended in a direction and supported by a frame including an opening, the unit mask comprising: a first fixed part located in the opening and fixed to one surface of the frame disposed in the direction, the first fixed part including a first bent extension bent and extended downward through the opening:
   a first block located between the frame and the first bent extension, and contacting the first bent extension; and
   a second block facing the first block with the first bent extension and a first facing part disposed between the first block and the second block;
   a second fixed part spaced apart from the first fixed part and fixed to another surface of the frame disposed in the direction; and
   a mask part held by the first fixed part and the second fixed part between the first fixed part and the second fixed part, the mask part comprising:
   a body extended in the direction; and the first facing part bent and extended from the body through the opening and facing the first bent extension,
   wherein the second block contacts the first facing part.

2. The unit mask of claim 1, wherein the mask part is thinner in a perpendicular direction to the direction in which the unit mask extends than the first fixed part and the second fixed part.

3. The unit mask of claim 1, wherein the second fixed part includes a second bent extension bent and extended downward through the opening, and wherein the mask part further comprises:
   a second facing part bent and extended from the body through the opening and facing the second bent extension.

4. The unit mask of claim 1, wherein the second block is thicker in a perpendicular direction to the direction in which the mask unit extends than the first block.

5. The unit mask of claim 1, further comprising a third block located between the first bent extension and the first facing part and contacting the first bent extension and the first facing part.

6. The unit mask of claim 1, further comprising a first fastener penetrating the first bent extension, the first block, the first facing part and the second block to fasten the first bent extension, the first block, the first facing part and the second block.

7. The unit mask of claim 1, wherein the surface of the first block contacting the first bent extension and the surface of the second block contacting the first facing part have saw-toothed shapes.

8. The unit mask of claim 5, wherein the surface of the first block contacting the first bent extension, the surface of the second block contacting the first facing part and the surface of the third block contacting the first bent extension and the first facing part have saw-toothed shapes.

9. The unit mask of claim 7, wherein the saw-toothed surface of the second block is spaced apart from the body of the mask part.

10. The unit mask of claim 7, wherein the first bent extension has an saw-toothed shape corresponding to the saw-toothed surface of the first block and the first facing part has an saw-toothed shape corresponding to the saw-toothed surface of the second block.

11. The unit mask of claim 7, wherein the first bent extension contacts the first facing part.

12. The unit mask of claim 3, further comprising:
   a fourth block located between the frame and the second bent extension and contacting the second bent extension; and
   a fifth block facing the fourth block, having the second bent extension and the second facing part located between the fourth block and the fifth block, and contacting the second facing part.

13. The unit mask of claim 12, further comprising a sixth block located between the second bent extension and the second facing part and contacting the second bent extension and the second facing part.

14. The unit mask of claim 12, further comprising a second fastener penetrating the second bent extension, the fourth block, the second facing part and the fifth block to fasten the second bent extension, the fourth block, the second facing part and the fifth block.

* * * * *